United States Patent [19]
Leu et al.

[11] Patent Number: 5,939,241
[45] Date of Patent: Aug. 17, 1999

[54] METHOD OF PREVENTING PHOTORESIST RESIDUE ON METAL LINES

[75] Inventors: Jen-Shiang Leu, Ta Teh; Jeng-Shiuan Shih, Changhua Hsien, both of Taiwan

[73] Assignee: Taiwan Semiconductor Manufacturing Co., Ltd., Hsinchu, Taiwan

[21] Appl. No.: 08/953,164

[22] Filed: Oct. 17, 1997

[51] Int. Cl.⁶ .............................. G03F 7/42; H01L 21/306
[52] U.S. Cl. ...................... 430/318; 430/323; 430/329; 430/330; 438/694; 438/710
[58] Field of Search .................... 430/318, 329, 430/323, 330; 438/694, 710

[56] References Cited

U.S. PATENT DOCUMENTS

| | | | |
|---|---|---|---|
| 4,845,053 | 7/1989 | Zajac | 437/229 |
| 5,792,672 | 8/1998 | Chan et al. | 438/6 |

FOREIGN PATENT DOCUMENTS

| | | |
|---|---|---|
| 63-145787 | 6/1988 | Japan . |
| 3-019319 | 1/1991 | Japan . |
| 3-088329 | 4/1991 | Japan . |

*Primary Examiner*—John A. McPherson
*Attorney, Agent, or Firm*—Christensen O'Connor Johnson & Kindness PLLC

[57] ABSTRACT

A method of preventing photoresist residue on metal lines is disclosed herein. A strip recipe with a preheat step has been developed for use with the Applied Materials Mxp Centura. The preheat step is performed before the strip step. The preheat step can rapidly shorten the temperature balance time between the wafer and the strip chamber and make the photoresist flow to increase photoresist surface area. Therefore, the strip photoresist rate will be improved by higher wafer temperature in the first few strip cycles.

13 Claims, 4 Drawing Sheets

METHOD OF PREVENTING PHOTORESIST RESIDUE ON METAL LINES

TECHNICAL FIELD OF THE INVENTION

The present invention relates to semiconductor fabrication, and more particularly, to a method of preventing photoresist residue from forming on metal lines.

BACKGROUND OF THE INVENTION

In semiconductor integrated circuit (IC) fabrication, metal lines are deposited to interconnect IC components and to connect IC components to pads. The metal lines are formed by physical deposition (such as by sputtering) of a layer of metal (such as aluminum). Photoresist is applied to the metal layer to define a pattern for forming lines that interconnect the desired components of the IC. Referring to FIG. 1, metal lines 10 are etched according to the pattern defined by the photoresist 14. One common apparatus used for such etching is the Applied Materials MxP Centura.

The Mxp Centura has four chambers: two chambers are etch chambers and two chambers are strip chambers which are called ASP chambers. A typical metal etching process is performed in the etch chamber at about 80 degrees centigrade. During a metal line etching process, the metal lines are etched using a chloride plasma, which will result in chloride formed on the surface of the metal lines. Furthermore, polymers 12 are also usually formed on the sidewalls of metal lines 10.

Referring to FIG. 3, after the metal lines 10 are etched in the etch chamber at etch step 30, the wafer is transferred from the etch chamber to the strip chamber (ASP chamber). The photoresist is then stripped in the strip chamber at a strip step 31, usually with a dry etching process at about 250 degrees centigrade. Afterward, the wafer is taken out of the strip chamber to cool the wafer. To remove the photoresist residue and polymer, two polymer strip steps (PRS) 32, 34 and one "Mattson" step 33 between the two polymer strip steps are then performed.

Referring to FIG. 4, a detailed flow diagram of strip step 31 of FIG. 3 is shown. A stabilization step 40 is performed, and gases, such as $N_2$, $H_2O$ and $O_2$, are inserted into the strip chamber to stabilize the response condition. In the strip chamber, at a temperature of about 250 degrees centigrade, an etching chloride process 41 and a stripping photoresist process 42 (together referred to as an strip cycle 43) are repeatedly performed several times to remove the chloride and the photoresist. Then, a pump is applied to take the response gases out of the strip chamber in a pumping step 44.

A typical removing chloride recipe is described as follows: 500 sccm $H_2O$/1400 watts/2 Torrs/10 seconds (a gas flow of $H_2O$ at about 500 sccm; an energy of etching at about 1400 watts; a gas pressure of the chamber at about 2 Torrs; an removing time of about 10 seconds). A typical strip photoresist recipe is described as follows: 300 sccm $H_2O$/3500 sccm $O_2$/200 sccm $N_2$/1400 watts/2 Torrs/20 seconds (a gas flow of $H_2O$ at about 300 sccm; a gas flow of $O_2$ at about 3500 sccm; a gas flow of $N_2$ at about 200 sccm; an energy of etching at about 1400 watts; a gas pressure of chamber at about 2 Torrs; an removing time of about 20 seconds). When the wafer is transferred form the etch chamber (80 degrees centigrade) to the strip chamber (250 degrees centigrade), the temperature difference between the wafer and the strip chamber is large. Indeed, there is a large temperature differential of about 170 degrees centigrade. Therefore, the time for the temperature to balance between the wafer and strip chamber is relatively long. Further, the strip cycle may be repeated a number of times, and may be repeated up to seven times.

Even with this cleaning technique, photoresist residue is sometimes observed on the metal lines. With the more densely packed metal layout for sub-micron devices, the impact of photoresist residue will be more noticeable. The photoresist residue 16 on densely packed metal lines 10 may remain on the metal lines 10, regardless of the number of times the stripping step is performed, as shown in FIG. 2. Further, the photoresist residue is difficult to detect during after-etch inspection (AEI). Also, in processing after the strip cycles, removal of the polymer 12 from the metal lines 10, as shown in FIG. 2, typically includes two stripping polymer steps (PRS) 32, 34. Additionally, it is necessary for a stripping photoresist residue step (Mattson) 33 to be added between the two PRS steps to remove photoresist residue remaining on the metal lines. Thus, there is an unmet need in the art for a method for preventing photoresist residue from forming on metal lines.

SUMMARY OF THE INVENTION

A method of preventing photoresist residue on metal lines is disclosed. The method comprises the steps of: providing a metal layer over a wafer; defining a pattern on the metal layer using a photoresist layer; etching the metal layer to form metal lines in an etch chamber using the photoresist layer as an etching mask; performing a preheat step in a strip chamber, the preheat step shortening the temperature balance time between the wafer and the strip chamber; and performing a strip step in the strip chamber to strip the photoresist layer.

DESCRIPTION OF THE PREFERRED EMBODIMENT

Photoresist residue on metal lines is found occasionally by quality control (QC) inspection of ICs. The photoresist residue typically formed on dense metal lines, and it is difficult to strip even with multiple strip cycles. Further, it is often hard to find in after etch inspection (AEI).

Figure 5:
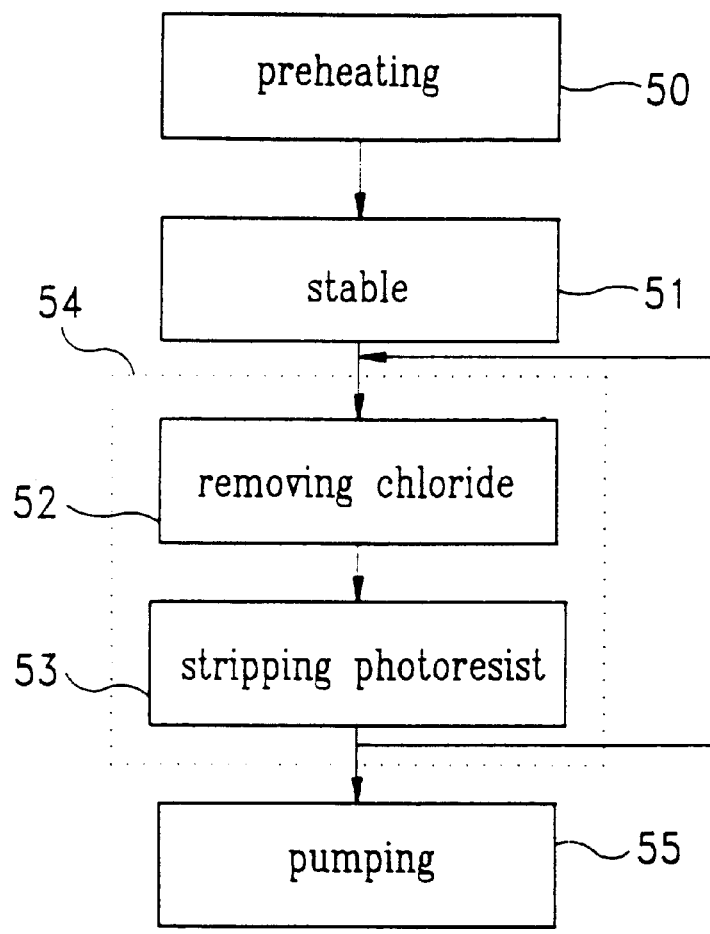
FIG. 5 is a detailed flow diagram showing a preheat step added before the prior art strip step in accordance with the present invention.

A method of preventing photoresist residue on metal lines is provided. A strip recipe with a preheat step has been developed for use with the Applied Materials MxP Centura to prevent the formation of photoresist residue. The method provides a preheat step after the etching metal step and before the strip step. The primary difference between the present invention and the prior art is the addition of a preheat step 50 before the strip recipe, as shown in FIG. 5.

When a wafer is transferred from the etch chamber to the strip chamber, the preheat step 50 is performed first at 240 degrees centigrade. The recipe of the preheat step 50 is described as follows: 500 sccm $H_2O$/500 sccm $N_2$/8 Torrs/10 seconds (a gas flow of $H_2O$ at about 500 sccm; a gas flow of $N_2$ at about 500 sccm; a gas pressure of chamber at about 8 Torrs; a time of preheating of about 10 seconds). Afterward, in a stabilizing step 51, gases, such as $N_2$, $H_2O$ and $O_2$, are inserted into the strip chamber to stabilize the response condition. An removing chloride step and a stripping photoresist step are then performed.

Figure 6:
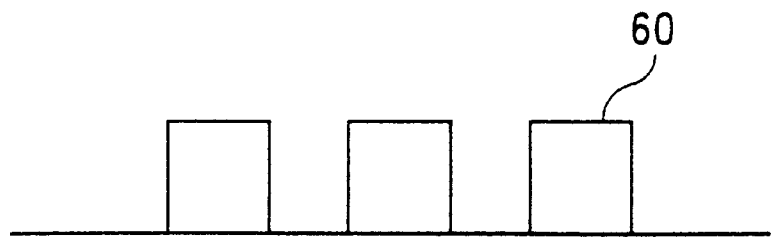
FIG. 6 is a cross-section view showing without photoresist residue on metal lines after stripping photoresist in accordance with the present invention.

The recipe of the removing chloride step 52 is described as follows: 500 sccm $H_2O$/1400 watts/2 Torrs/10 seconds (a gas flow of $H_2O$ at about 500 sccm; an energy of etching at about 1400 watts; a gas pressure of the chamber at about 2 Torrs; an removing time of about 10 seconds). The recipe of said stripping photoresist step 53 is described as follows: 300 sccm $H_2O$/3500 sccm $O_2$/200 sccm $N_2$/1400 watts/2 Torrs/20 seconds (a gas flow of $H_2O$ at about 300 sccm; a gas flow of $O_2$ at about 3500 sccm; a gas flow of $N_2$ at about 200 sccm; an energy of etching of about 1400 watts; a gas pressure of the chamber at about 2 Torrs; an removing time of about 20 seconds). The removing chloride step 52 and the stripping photoresist step 53 are collectively an strip cycle 54 that is repeatedly performed several times to remove the chloride and photoresist. Then, a pump is applied to remove the response gases out of the strip chamber in a pumping step 55. After the process of FIG. 5, the result is as shown in FIG. 6 where the metal lines 60 have no photoresist residue.

In the prior art, the temperature of the ASP chamber is at 250 degrees centigrade higher than the photoresist melting point. When a wafer is transferred from the etch chamber at 80 degrees centigrade to the strip chamber, the temperature difference between the wafer and the strip chamber is large. Therefore, the temperature balance time is very long, which in turn will increase the number of strip cycles needed to remove the photoresist. In the present invention, adding a preheat step can shorten the temperature balance time between the wafer and the strip chamber and make the photoresist to flow which increases the photoresist surface area.

Furthermore, the stripping rate of the photoresist is increased with the increased temperature. Therefore, the ability of the photoresist stripping step is increased, and the strip rate will be improved by the higher wafer temperature in the first few strip cycles. Thus, the number of strip cycles will be reduced. However, it is important that the preheat time should be controlled carefully to avoid photoresist hardening. The preheat step is typically suitably performed between about 5 and 15 seconds, and preferably about 10 seconds. The lower end of the time range of about 5 seconds allows throughput to be increased over the 10 seconds preheating embodiment. The upper end of the time range prevents the photoresist from excessive hardening.

Figure 1:
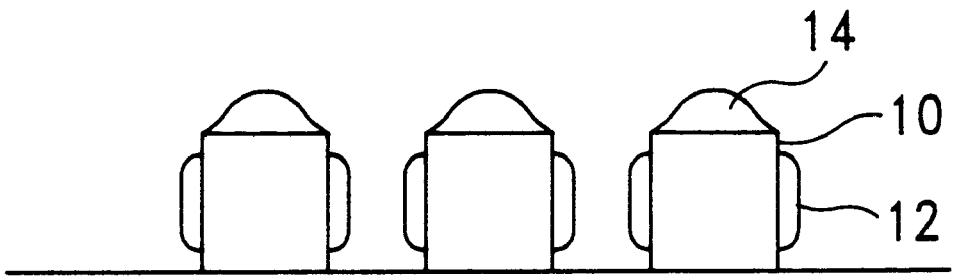
FIG. 1 is a cross-section view showing metal lines after etching a metal layer in accordance with the prior art.
Figure 2:
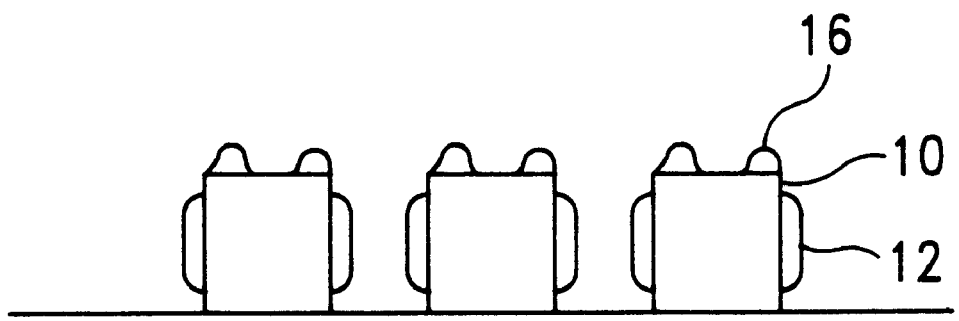
FIG. 2 is a cross-section view showing photoresist residue on metal lines after stripping photoresist in accordance with the prior art.
Figure 3:
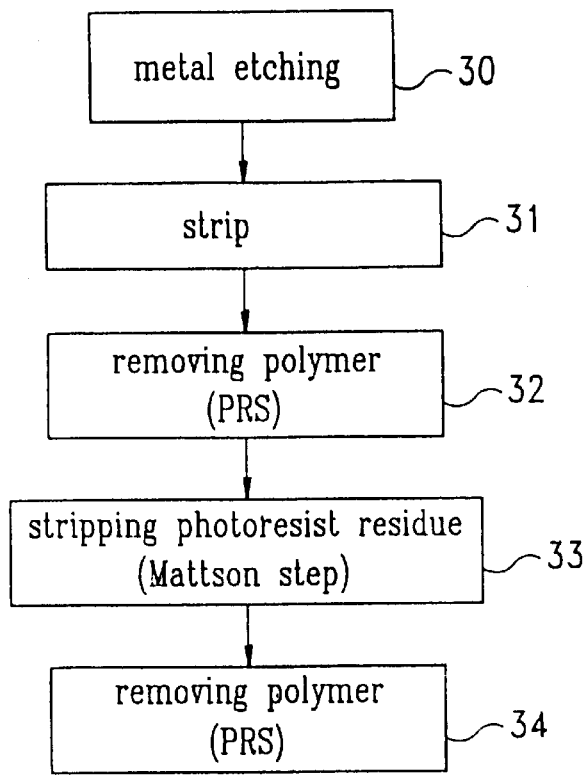
FIG. 3 is a flow diagram showing the steps of forming metal lines and removing polymers and photoresist residue in accordance with the prior art.
Figure 4:
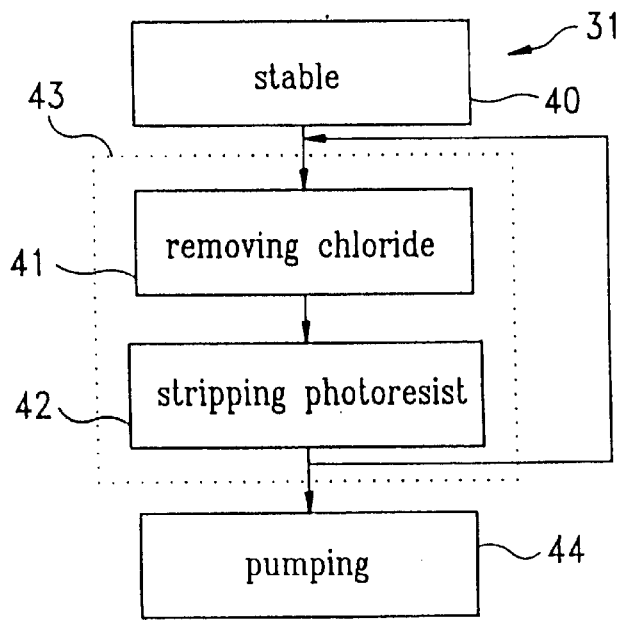
FIG. 4 is a detailed flow diagram of a prior art strip step.

Additionally, with the temperature increased, polymers will harden. In the prior art strip recipe, the temperature of the strip chamber is at 250 degrees centigrade. However, with the strip recipe of the present invention adding the preheat step, the temperature of the strip chamber is at 240 degrees centigrade. The temperature of the new strip recipe is lower than the prior art strip recipe. Therefore, the preheating step reduce the risk of polymer hardening and polymers and polymers are easily removed after the strip cycles are completed. Referring to FIG. 3, in the conventional method, after the etching metal step 30 and the stripping photoresist step 31 are performed, an etching polymer step (PRS) 32 with typically a wet etching process is performed. Afterwards, photoresist residue is stripped via a Mattson step 33 with typically a wet etching process. Another PRS step 34 is performed. In the conventional method, the strip recipe is at a higher temperature of about 250 degrees centigrade. This will cause the polymers to be harder. Therefore, it is necessary for two PRS steps 32, 34 to remove the polymers, and requires a Mattson step 33 between the two PRS steps to remove the photoresist residue.

Figure 7:
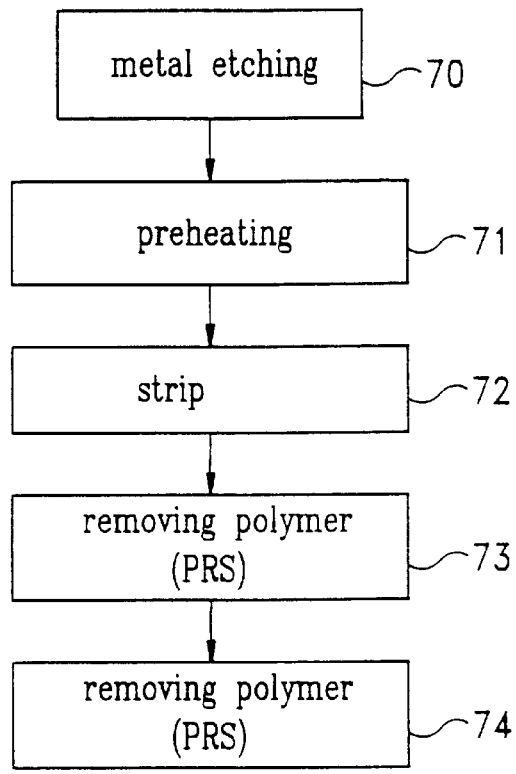
FIG. 7 is a flow diagram illustrating the method of the present invention.

Referring to FIG. 7, according to the present invention, after the etching metal step 70, the preheat step 71 is performed. Afterwards, the strip step 72 is performed. Because of the present invention, photoresist residue is nearly nonexistent on the metal lines. Therefore, the polymers can be removed merely by two stripping polymer steps (PRS) 73, 74, and it is not necessary to add the extra Mattson strip step to remove photoresist residue.

Figure 8:
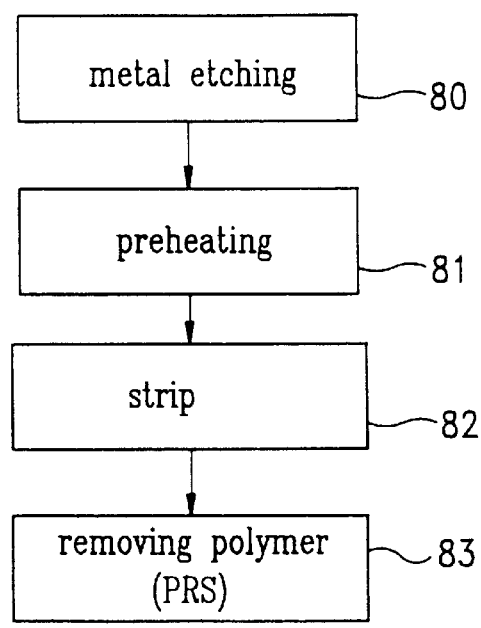
FIG. 8 is a flow diagram illustrating the method of the present invention.

Additionally, in the new strip recipe of the present invention, the temperature of the strip chamber is 240 degrees centigrade, lower than the prior art strip recipe temperature of 250 degree centigrade. While the temperature of the strip chamber is suitably reduced in the new strip recipe, polymers will be more easily removed than that in the old strip recipe. Thus, it may be that only one PRS step 83 is required to remove the polymers after the etching metal step 80 and the strip step 82, as shown in FIG. 8.

Accordingly, the present invention teaches that a preheat step is added after the etching metal step and before the strip step. The preheat step is performed at about 240 degrees centigrade in the strip chamber. The preheat step serves to rapidly balance the temperature between the wafer and ASP chamber. Therefore, the ability of the photoresist stripping step can be increased in the first few strip cycles. The preheat step allows the strip time to be shortened and throughput to be increased.

Additionally, the strip recipe with the preheat step can effectively simplify the process of removing polymers and photoresist residue after the strip cycles are completed. The preheat step enables substantially all photoresist residue to be removed in about five strip cycles. In the present invention, the process of removing the polymers and photoresist residue can be performed only by two PRS steps. Further, the preheat step oftentimes permits the polymers to be preferably removed merely by one PRS step. The specific recipe is just an example in the embodiment of the present invention. The main point is the concept of preheating. Therefore, a suitable temperature of preheating and a suitable preheating time can effectively remove photoresist residue in the strip step. Also, preheating can simplify the process of removing the polymers after the strip cycles are completed.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. A method of preventing photoresist residues on metal lines comprising steps of:

providing a metal layer over a wafer;

forming a patterned photoresist layer on said metal layer;

etching said metal layer to form metal lines using said patterned photoresist layer as an etching mask;

preheating said wafer in a strip chamber by injecting carried gas inflows to prevent said photoresist residues from forming on said metal lines; and stripping said patterned photoresist layer.

2. The method of claim 1, wherein said metal layer is etched using a chloride containing plasma as an etchant, resulting in a chloride passivation layer being formed on a surface of said metal lines and a polymer layer being formed on sidewalks of said metal lines.

3. The method of claim 1, wherein said carried gas inflows are a gas flow of $H_2O$ and a gas flow of $N_2$.

4. The method of claim 1, wherein said step of preheating said wafer is done for a period of time of about 5–15 seconds.

5. The method of claim 1, wherein said step of preheating said wafer is in a strip chamber with a pressure of about 8 torr.

6. The method of claim 1, wherein said step of stripping of said patterned photoresist layer comprises:

etching a chloride passivation layer, which is formed while performing said step of etching said metal layer by $O_2$, $N_2$ and $H_2O$ gases;

stripping said patterned photoresist layer; and pumping said $O_2$, $N_2$ and $H_2O$ gases out of said strip chamber.

7. The method of claim 6, wherein said etching of said chloride passivation layer uses a recipe of:

a gas flow of $H_2O$ being at about 500 sccm;

an energy of etching being at about 1400 watts;

a gas pressure of said strip chamber being of about 2 torr; and an etching time of said etching passivation layer being about 10 seconds.

8. A method of preventing photoresist residues on metal lines comprising steps of:

providing a metal layer over a wafer;

forming a patterned photoresist layer on said metal layer;

etching said metal layer to form metal lines using said patterned photoresist layer as an etching mask, said metal layer being etched via a chloride plasma, resulting in a chloride passivation layer being formed on the surface of said metal lines and a polymer layer being formed on sidewalls of said metal lines;

preheating said wafer in a strip chamber by injecting gas flows of $H_2O$ and $N_2$ to prevent said patterned photoresist residues on said metal lines;

removing said chloride passivation layer; and stripping said patterned photoresist layer.

9. The method of claim 8, wherein said step of preheating said wafer is in a strip chamber with a pressure of about 8 torr.

10. The method of claim 8, wherein said step of preheating said wafer is done for a period of time of about 5–15 seconds.

11. The method of claim 8, wherein said step of stripping said patterning photoresist layer comprises:

etching a chloride passivation layer, which is formed while performing said step of etching said metal layer by injecting $O_2$, $N_2$ and $H_2O$ gases;

stripping said patterning photoresist layer; and pumping said $O_2$, $N_2$ and $H_2O$ gases out said strip chamber.

12. The method of claim 11, wherein said step of etching said chloride passivation layer uses a recipe of:

a gas flow of $H_2O$ being at about 500 sccm;

an energy of etching being at about 1400 watts;

a gas pressure of said strip chamber being about 2 torr; and an etching time of said etching passivation layer being about 10 seconds.

13. A method of preventing photoresist residue on metal lines comprising steps of:

providing a metal layer on the substrate of a wafer, said metal layer having a pattern defined therein by a photoresist layer;

etching said metal layer to form metal lines in an etch chamber using said photoresist layer as an etching mask, said metal layer being etched via a chloride plasma, a chloride passivation being formed on the surface of said metal lines and a polymer layer being formed on the sidewalls of said metal lines, said etch chamber being at about 80 degrees centigrade;

performing a preheat step in a strip chamber, said preheat step shortening the temperature balance time between said wafer and said strip chamber, said strip chamber being at about 240 degrees centigrade, a recipe of said preheat step comprising:

a gas flow of $H_2O$ being at about 500 sccm;

a gas flow of $N_2$ being at about 500 sccm;

a gas pressure of said strip chamber being at about 8 torr; and said preheat step being performed between about 5 and 15 seconds;

performing a stabilization step for inserting the $H_2O$ and $N_2$ gases into said strip chamber;

performing a removing chloride step for removing said chloride in said photoresist and said polymers;

performing a stripping photoresist step for stripping said photoresist layer; and performing a pumping step for removing the $H_2O$ and $N_2$ gases out of said strip chamber.

* * * * *